United States Patent [19]

Iseman

[11] Patent Number: 5,001,376
[45] Date of Patent: Mar. 19, 1991

[54] ROTATING RECTIFIER ASSEMBLY

[75] Inventor: Walter J. Iseman, Monroe Center, Ill.

[73] Assignee: Sundstrand Corporation, Rockford, Ill.

[21] Appl. No.: 478,918

[22] Filed: Feb. 12, 1990

[51] Int. Cl.⁵ .................. H02K 9/00; H02M 7/04
[52] U.S. Cl. .................................. 310/68 D; 310/71; 363/145
[58] Field of Search ............... 310/68 R, 68 D, 71; 318/138, 254; 363/126, 145

[56] References Cited

U.S. PATENT DOCUMENTS

| | | |
|---|---|---|
| 4,581,695 | 4/1986 | Hoppe ............................ 310/68 D |
| 4,621,210 | 11/1986 | Krinickas, Jr. . | |
| 4,628,219 | 12/1986 | Troscinski . | |
| 4,745,315 | 5/1988 | Terry, Jr. et al. ............. 310/68 D |
| 4,794,510 | 12/1988 | Wege . | |
| 4,806,814 | 2/1989 | Nold . | |
| 4,827,165 | 5/1989 | Nold ............................. 310/68 D |

Primary Examiner—Steven L. Stephan
Assistant Examiner—D. L. Rebsch
Attorney, Agent, or Firm—Wood, Phillips, Mason Recktenwald & VanSanten

[57] ABSTRACT

The problem of assembling and maintaining good electrical contact in a rotating rectifier assembly (40) is solved using deformable connectors (66). The rectifier assembly (40) includes three planar disks (48) which are linearly aligned and spaced along an axis (42). Six diode wafers (58) are arranged in two parallel planes which are parallel to the axis (42). The three diodes (58) in each plane are positioned on one of the oppositely directed planar faces (50, 52) of the disks (48). The three diodes (58) in each plane are connected by a copper connector bar (46) which forms an output. The assembly is surrounded by an insulating sleeve (62), and three deformable spring rings (66) are used to provide an interference fit.

12 Claims, 1 Drawing Sheet

ROTATING RECTIFIER ASSEMBLY

FIELD OF THE INVENTION

This invention relates to a dynamoelectric machine and, more particularly, to a rotating rectifier assembly therefor.

BACKGROUND OF THE INVENTION

In one known form, a dynamoelectric machine comprises a generator for use in aircraft. Such a generator may include a main generator, a rotating rectifier bridge assembly, an exciter and a permanent magnet generator (PMG). Each of the main generator, exciter and PMG include a rotor driven via a common shaft. The PMG is a pilot generator used to develop output power which is rectified to provide excitation to an exciter stator winding. The exciter rotor carries a three phase ac armature winding connected through the rotating rectifier assembly to a dc field winding of the main generator to develop three phase output power in a stator armature winding.

A typical rotating bridge rectifier assembly is illustrated in Troscinski U.S. Pat. No. 4,628,219. This rectifier assembly includes a tubular housing receiving a stack of plates sandwiching diode wafers. Because of the sandwiching structure, numerous parts are required and the housing must be of a sufficient length to accommodate these parts. This requirement is in conflict with the need to minimize the size and weight of components in an aircraft. Further, such a device can be difficult to assemble.

One alternative form of a rotating rectifier assembly is illustrated in Hoppe U.S. Pat. No. 4,581,695 which includes two side-by-side conductive blocks, each having three outwardly facing diode receiving surfaces. A diode is positioned on each surface and three phase bars are used to connect aligned diodes for each of the two blocks. A metal housing is shrink fitted using thermograding to hold the structure in assembled relation. As a result this assembly could not be repaired without destroying the housing.

The present invention is directed to overcoming one or more of the problems as set forth above.

SUMMARY OF THE INVENTION

In accordance with the present invention, a rectifier assembly is provided with a deformable connector for maintaining the assembly in assembled relation.

Broadly, there is disclosed herein a rectifier assembly including a plurality of conductive plates each having opposite surfaces and insulated means for mounting the conductive plates linearly aligned in a plane. A plurality of diode wafers, two for each said conductive plate, are positioned each on one of the surfaces of one of the conductive plates so that the diode wafers are linearly aligned in opposite first and second planes. First and second conductive output bars sandwich the diode wafers on opposite sides of the plates, whereby the first output bar is positioned in contact with the diode wafers in the first plane and the second output bar is positioned in contact with the diode wafers in the second plane. Input terminal means electrically connect each plate to a respective phase of an AC input source. A deformable connector surrounds the output bars for maintaining the output bars, the diode wafers and the plates in assembled relation.

In accordance with one aspect of the invention, the deformable connector comprises a plurality of spring rings, wherein each spring ring surrounds the output bars linearly adjacent one of the plates.

It is a feature of the invention that the insulated means comprises a molded elongate plate.

It is another feature of the invention that the conductive plates are molded into the molded elongate plate.

It is still another feature of the invention that an insulating sleeve is disposed between the output bars and the deformable connector.

In accordance with another aspect of the invention, the rotating rectifier assembly is provided for a dynamoelectric machine operable to rectify three phase AC power to DC power. The assembly comprises three conductive disks, one for each phase, and each having opposite surfaces. Insulated means mount the conductive disks in a plane and linearly aligned with respect to one another and longitudinally spaced along a central axis. Six diode wafers are included, two for each phase, each diode wafer being positioned on one of the disk surfaces, whereby the diode wafers are linearly aligned in opposite first and second planes. First and second conductive output bars are parallel to the axis and radially outwardly of the first and second planes. A tubular insulation sleeve is coaxial about the central axis and surrounds the output bars. Input terminal means electrically connect each phase plate to a respective phase of an AC power source. A deformable, tubular connector surrounds the insulation sleeve for providing an interference fit to maintain the first output bar in contact with the three diode wafers in the first plane, and the second output bar in contact with the three diode wafers in the second plane.

Particularly, the rectifier assembly includes three planar, linearly aligned conductive disks molded into an insulating elongate plate. A lead from each insert extends through the plate and exits at one end thereof through a circular flange. The opposite surfaces of each disk are exposed and each receives a diode wafer. Thus, there are a total of six diode wafers, two associated with each disk. A pair of conductor bars are aligned on opposite sides of the molded plate in contact with the three diode wafers on each side, opposite the disks. The conductor bars extend out through openings in the flange. A cylindrical insulating sleeve surrounds the plates and diodes and a spring ring comprising a spring steel band is deformed during installation and surrounds the sleeve at each diode. The spring steel provides an interference fit which concentrates the load at each diode and provides preload and holds against centrifugal loads. The spring rings also provide compressive forces to maintain the conductor bars in electrical contact with the diodes, and the diodes in electrical contact with the disks.

Further features and advantages of the invention will readily be apparent from the specification and from the drawings

DETAILED DESCRIPTION OF THE INVENTION

Figures 1, 4:
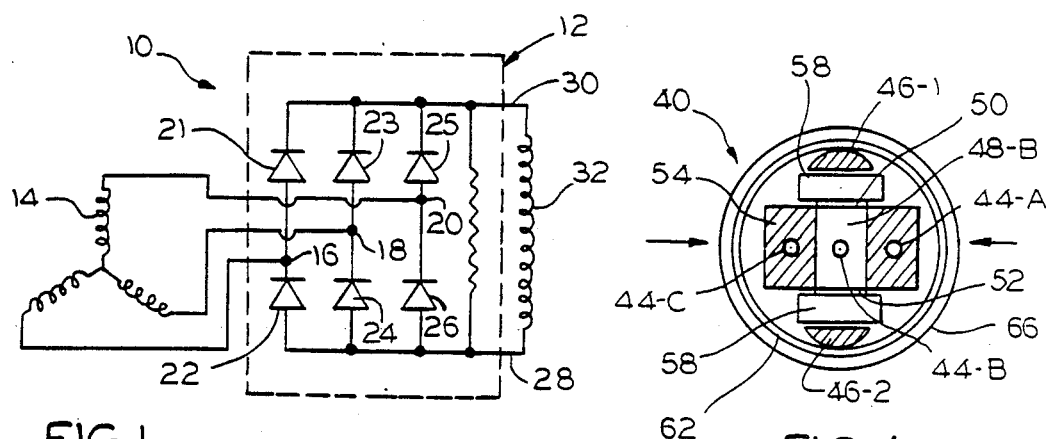
FIG. 1 is a schematic diagram of a rotating rectifier assembly employed in a generator.
FIG. 4 is a sectional view taken along the line 4—4 of FIG. 2.

With reference to FIG. 1, a schematic diagram illustrates a portion of a brushless generator 10 including a rotating rectifier bridge assembly 12. Although the complete generator 10 is not illustrated herein, such a generator, as discussed above, may include an exciter including a three phase rotor armature winding 14 which develops three phase ac power supplied to junctions 16, 18 and 20 of the rectifier assembly 12. The rectifier assembly 12 includes six diodes 21-26 connected in a bridge configuration to the junctions 16, 18 and 20 to develop dc output power at opposite rails 28 and 30. The dc power is provided to a dc rotor field winding 32 of a main generator (not shown).

Each of the windings 14 and 32 and rectifier assembly 12 are mounted in a rotor in the brushless power generator. The polyphase voltage developed in the exciter armature winding 14, caused by rotation of the rotor is rectified by the rectifier assembly 12 to power the main field winding 32 which is used to develop AC output power, as is well known.

With reference to FIGS. 2-5, there is illustrated a rotating rectifier bridge assembly 40 according to the invention. Specifically, the rectifier assembly 40 is operable to rectify three phase AC power to DC power, as discussed above.

Figure 2:
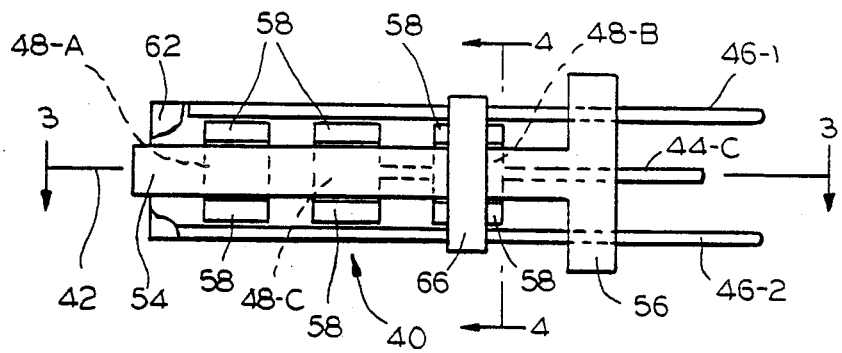
FIG. 2 is an enlarged sectional, partially cutaway view of a rectifier assembly according to the invention, with parts removed for clarity.
Figure 3:
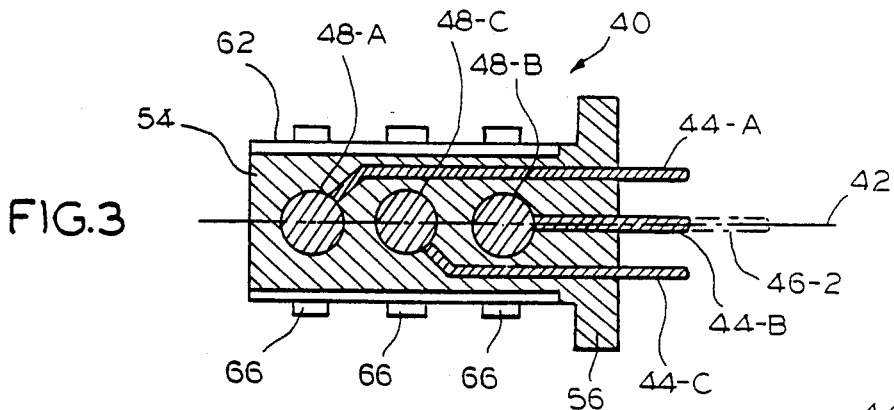
FIG. 3 is a sectional view taken along the line 3—3 of FIG. 2.

The rectifier assembly 40 is generally cylindrical about a central axis represented by a line 42 and includes input terminals 44-A, 44-B, and 44-C extending axially outwardly at one end, see FIG. 3, and output terminals 46-1 and 46-2, see FIG. 2, extending axially outwardly at the same end. The input terminals 44 are used for electrically connecting the assembly 40 to the respective phases of an ac power source, such as the winding 14, see FIG. 1. Similarly, the output terminals 46 are used for electrically connecting the rectifier assembly 40 to a point of use, such as the DC field winding 32, see FIG. 1. For simplicity herein, the suffixes are omitted when referring to one of plural elements generally.

The assembly 40 includes three electrically conductive phase disks 48 each having opposite planar surfaces 50 and 52. The phase disks 48 represent the junctions 16, 18 and 20, illustrated in FIG. 1. The disks 48 may be integrally molded into an elongate plate 54 of an insulating material, see FIG. 5. Particularly, the disks are planar and axially aligned, and are longitudinally spaced along the axis 42. The faces of plate 54 are generally parallel to axis 42 and include a circular flange 56 at one end.

The three input terminals 44 comprise lead wires connected as by brazing to the three disks 48. The wires 44 are similarly molded into the plate 54 and are routed therethrough and exit through the flange 56. Particularly, the lead wire 44-B is coaxial with the axis 42 and the other leads 44-A and 44-C are spaced radially outwardly thereof in a common plane.

Six diode wafers 58 are arranged in two parallel planes which are parallel to the axis 42 and on opposite sides of the plate 54. Specifically, there are three linearly aligned diode wafers 58 in each plane, the three diodes in each plane being positioned, see FIG. 2, on the opposite surfaces 50 or 52 of the three disks 48. The output terminals 46 comprise first and second output connector bars aligned on opposite sides of the plate 54 in contact with the three diode wafers 58 on each side, opposite the disks 48. The connector bars 46 extend parallel to the axis 42 and pass through openings 60 through the flange 56 on either side of the plate 54.

The above-described assembly is somewhat cylindrical and is surrounded by a tubular insulating sleeve 62. The sleeve 62 extends axially from the flange 56 to the opposite end 64 of the plate 54. The sleeve 62 insulates the field connector bars 46 and also provides a means for containing coolant oil flow through the assembly 40.

A connector in the form of three spring rings 66 is deformed during installation and surrounds the sleeve 62 at axial positions corresponding to the position of each disk 48 and pair of diodes 58. The spring rings 66 provide an interference fit to compress the electrical insulating sleeve 62 and exert a radially inwardly directed force on the connector bars 46 to concentrate the load at each diode 58 and to provide preload and hold against centrifugal loads. This force maintains the field connector bars 46 in electrical contact with the diodes 58, and the diodes 58 in electrical contact with the disks 48.

As is illustrated in FIG. 4, the diameter of the assembly 40 is greater through the connector bars 46 than through the plate 54. To install the spring rings 66, a side force, represented by the arrows, is exerted by, for example, an arbor (not shown) to deform the rings 66 to an elliptical shape. The rings 66 are then dropped over the sleeve 62 to the required position and the side pressure released to clamp the assembly together. The assembly 40 can be disassembled for repair, or otherwise, by reversing this method.

Figure 5:
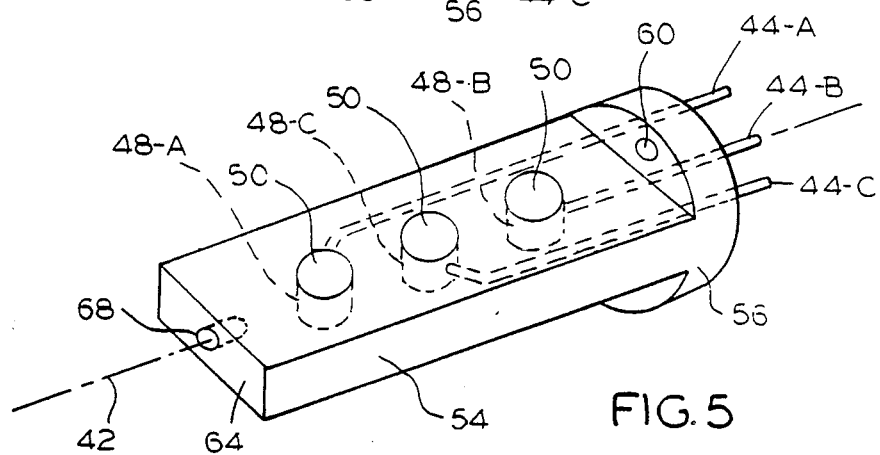
FIG. 5 is an isometric view of a molded insulating plate for the rectifier assembly of FIG. 2.

A bore 68 in the plate end 64, see FIG. 5, may be tapped for insertion and removal of the assembly 40 by a suitable tool.

As an alternative, the three spring rings 66 could be replaced with a single elongate, cylindrical ring, possibly having inner ridges to concentrate the load at each diode pair.

Thus, in accordance with the invention, the rectifier assembly 40 is assembled using deformable connectors and requiring minimal parts to reduce weight. The use of a deformable connector also assures that proper electrical contact is provided which assures efficiency of operation.

The disclosed invention is illustrative of the broad inventive concepts comprehended by the invention.

I claim:

1. A rectifier assembly comprising:
   a plurality of conductive disks each having opposite surfaces;
   insulated means for mounting said disks linearly aligned in a plane;
   a plurality of diode wafers, two for each said disk, wherein each said diode wafer is positioned on one of the surfaces of one of the disks so that said diode wafers are linearly aligned in opposite first and second planes;
   first and second conductive output bars sandwiching said diode wafers on opposite sides of said disks, whereby said first output bar is positioned in contact with the diode wafers in said first plane and said second output bar is positioned in contact with the diode wafers in said second plane; and a deformable connector surrounding said output bars for maintaining said output bars, said diode wafers and said plates in assembled relation.

2. The rectifier assembly of claim 1 wherein said deformable connector comprises a plurality of spring rings, wherein each spring ring surrounds the output bars linearly adjacent one of said disks.

3. The rectifier assembly of claim 1 wherein said insulated means comprises a molded elongate plate.

4. The rectifier assembly of claim 3 wherein said disks are molded into said molded elongate plate.

5. The rectifier assembly of claim 1 further comprising an insulating sleeve disposed between said output bars and said deformable connector.

6. A rotating rectifier assembly for a dynamoelectric machine operable to rectify three phase ac power to dc power, comprising:
   three conductive disks, one for each phase, each having opposite surfaces;
   insulated means for mounting said conductive disks in a plane and linearly aligned with respect to one another and longitudinally spaced along a central axis;
   six diode wafers, two for each phase, each diode wafer being positioned on one of said disk surfaces, whereby said diode wafers are linearly aligned in opposite first and second planes;
   first and second conductive output bars parallel to said axis and radially outwardly of said first and second planes;
   a tubular insulation sleeve coaxial about said central axis and surrounding said output bars; and
   a deformable, tubular connector surrounding said insulation sleeve for providing an interference fit to maintain said first output bar in contact with the three diode wafers in said first plane, and said second output bar in contact with the three diode wafers in said second plane.

7. The rotating rectifier assembly of claim 6 wherein said deformable connector comprises three spring rings, wherein each spring ring surrounds the sleeve and is linearly aligned with one of said disks.

8. The rotating rectifier assembly of claim 6 wherein wherein said insulated means comprises a molded elongate plate.

9. The rotating rectifier assembly of claim 8 wherein said disks are molded into said molded elongate plate.

10. The rotating rectifier assembly of claim 6 wherein said output bars extend axially outwardly of said insulated means for connection to a point of use.

11. The rotating rectifier assembly of claim 6 further comprising input terminals connecting said disks to an ac power source.

12. The rotating rectifier assembly of claim 11 wherein said input terminals comprise lead wires connected to said disks and supported by said insulated means.

* * * * *